US011844204B2

(12) United States Patent
Purayath et al.

(10) Patent No.: US 11,844,204 B2
(45) Date of Patent: Dec. 12, 2023

(54) PROCESS FOR PREPARING A CHANNEL REGION OF A THIN-FILM TRANSISTOR IN A 3-DIMENSIONAL THIN-FILM TRANSISTOR ARRAY

(71) Applicant: SUNRISE MEMORY CORPORATION, San Jose, CA (US)

(72) Inventors: Vinod Purayath, Sedona, AZ (US); Jie Zhou, San Jose, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 18/050,937

(22) Filed: Oct. 28, 2022

(65) Prior Publication Data
US 2023/0072345 A1  Mar. 9, 2023

Related U.S. Application Data

(63) Continuation of application No. 17/125,477, filed on Dec. 17, 2020, now Pat. No. 11,515,309.
(Continued)

(51) Int. Cl.
*H01L 29/66* (2006.01)
*H10B 99/00* (2023.01)
(Continued)

(52) U.S. Cl.
CPC ......... *H10B 99/00* (2023.02); *H01L 21/3065* (2013.01); *H01L 29/6675* (2013.01);
(Continued)

(58) Field of Classification Search
CPC ............ H01L 27/1052; H01L 21/3065; H01L 29/6675; H01L 29/78642; H01L 29/78663;
(Continued)

(56) References Cited

U.S. PATENT DOCUMENTS

| 4,213,139 A | 7/1980 | Rao |
| 4,984,153 A | 1/1991 | Kregness et al. |

(Continued)

FOREIGN PATENT DOCUMENTS

| CN | 107658317 A | 2/2018 |
| JP | 1998-269789 A2 | 10/1998 |

(Continued)

OTHER PUBLICATIONS

Kim, N., et al., "Multi-layered Vertical gate NANO Flash Overcoming Stacking Limit for Terabit Density Storage", Symposium on VLSI Tech. Dig. of Technical Papers, 2009, pp. 188-189.
(Continued)

*Primary Examiner* — Sheikh Maruf
(74) *Attorney, Agent, or Firm* — Edward C. Kwok; VLP Law Group LLP

(57) ABSTRACT

A process includes (a) providing a semiconductor substrate having a planar surface; (b) forming a plurality of thin-film layers above the planar surface of the semiconductor substrate, one on top of another, including among the thin-film layers first and second isolation layers, wherein a significantly greater concentration of a first dopant specie is provided in the first isolation layer than in the second isolation layer; (c) etching along a direction substantially orthogonal to the planar surface through the thin-films to create a trench having sidewalls that expose the thin-film layers; (d) depositing conformally a semiconductor material on the sidewalls of the trench; (e) annealing the first isolation layer at a predetermined temperature and a predetermined duration such that the first isolation layer act as a source of the first dopant specie which dopes a portion of the semiconductor material adjacent the first isolation layer; and (f) selectively etching the semiconductor material to remove the (Continued)

doped portion of the semiconductor material without removing the remainder of the semiconductor material.

21 Claims, 6 Drawing Sheets

Related U.S. Application Data

(60) Provisional application No. 62/950,390, filed on Dec. 19, 2019.

(51) Int. Cl.
*H01L 29/786* (2006.01)
*H01L 21/3065* (2006.01)

(52) U.S. Cl.
CPC .. *H01L 29/78642* (2013.01); *H01L 29/78663* (2013.01); *H01L 29/78672* (2013.01)

(58) Field of Classification Search
CPC ......... H01L 29/78672; H01L 27/11551; H01L 27/11578; H01L 21/31116
USPC ....................................................... 438/268
See application file for complete search history.

(56) References Cited

U.S. PATENT DOCUMENTS

| | | |
|---|---|---|
| 5,388,246 A | 2/1995 | Kasai |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,880,993 A | 3/1999 | Kramer et al. |
| 5,915,167 A | 6/1999 | Leedy |
| 6,040,605 A | 3/2000 | Sano et al. |
| 6,057,862 A | 5/2000 | Margulis |
| 6,107,133 A | 8/2000 | Furukawa et al. |
| 6,118,171 A | 9/2000 | Davies et al. |
| 6,130,838 A | 10/2000 | Kim et al. |
| 6,313,518 B1 | 11/2001 | Ahn et al. |
| 6,314,046 B1 | 11/2001 | Kamiya et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,627,503 B2 | 9/2003 | Ma |
| 6,744,094 B2 | 6/2004 | Forbes |
| 6,754,105 B1 | 6/2004 | Chang et al. |
| 6,774,458 B2 | 8/2004 | Fricke et al. |
| 6,781,858 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,284,226 B1 | 10/2007 | Kondapalli |
| 7,307,308 B2 | 12/2007 | Lee |
| 7,335,906 B2 | 2/2008 | Toda |
| 7,426,141 B2 | 9/2008 | Takeuchi |
| 7,465,980 B2 | 12/2008 | Arimoto et al. |
| 7,489,002 B2 | 2/2009 | Forbes et al. |
| 7,495,963 B2 | 2/2009 | Edahiro et al. |
| 7,512,012 B2 | 3/2009 | Kuo |
| 7,524,725 B2 | 4/2009 | Chung |
| 7,542,348 B1 | 6/2009 | Kim |
| 7,612,411 B2 | 11/2009 | Walker |
| 7,709,359 B2 | 5/2010 | Boes et al. |
| 7,804,145 B2 | 9/2010 | Shimizu et al. |
| 7,872,295 B2 | 1/2011 | Park et al. |
| 7,876,614 B2 | 1/2011 | Kang et al. |
| 7,898,009 B2 | 3/2011 | Wilson et al. |
| 7,940,563 B2 | 5/2011 | Yokoi |
| 8,026,521 B1 | 9/2011 | Or-Bach et al. |
| 8,139,418 B2 | 3/2012 | Carman |
| 8,178,396 B2 | 5/2012 | Sinha et al. |
| 8,237,213 B2 | 8/2012 | Liu |
| 8,242,504 B2 | 8/2012 | Kim |
| 8,278,183 B2 | 10/2012 | Lerner |
| 8,304,823 B2 | 11/2012 | Boescke |
| 8,383,482 B2 | 2/2013 | Kim et al. |
| 8,395,942 B2 | 3/2013 | Samachisa et al. |
| 8,417,917 B2 | 4/2013 | Emma et al. |
| 8,513,731 B2 | 8/2013 | Lee et al. |
| 8,604,618 B2 | 12/2013 | Cooney et al. |
| 8,630,114 B2 | 1/2014 | Lue |
| 8,653,672 B2 | 2/2014 | Leedy |
| 8,743,612 B2 | 6/2014 | Choi et al. |
| 8,767,436 B2 | 7/2014 | Scalia et al. |
| 8,767,473 B2 | 7/2014 | Shim et al. |
| 8,848,425 B2 | 9/2014 | Schloss |
| 8,878,278 B2 | 11/2014 | Alsmeier et al. |
| 9,053,801 B2 | 6/2015 | Sandhu et al. |
| 9,053,802 B2 | 6/2015 | Mueller |
| 9,158,622 B2 | 10/2015 | Lee et al. |
| 9,190,293 B2 | 11/2015 | Wang et al. |
| 9,202,694 B2 | 12/2015 | Konevecki et al. |
| 9,219,225 B2 | 12/2015 | Karda et al. |
| 9,230,985 B1 | 1/2016 | Wu et al. |
| 9,231,206 B2 | 1/2016 | Tao et al. |
| 9,256,026 B2 | 2/2016 | Thacker et al. |
| 9,263,577 B2 | 2/2016 | Ramaswamy et al. |
| 9,281,044 B2 | 3/2016 | Ramaswamy et al. |
| 9,297,971 B2 | 3/2016 | Thacker et al. |
| 9,299,580 B2 | 3/2016 | Kong et al. |
| 9,337,210 B2 | 5/2016 | Karda et al. |
| 9,362,487 B2 | 6/2016 | Inumiya et al. |
| 9,391,084 B2 | 7/2016 | Lue |
| 9,412,752 B1 | 8/2016 | Yeh et al. |
| 9,455,268 B2 | 9/2016 | Oh et al. |
| 9,472,560 B2 | 10/2016 | Ramaswamy et al. |
| 9,502,345 B2 | 11/2016 | Youn et al. |
| 9,530,794 B2 | 12/2016 | Ramaswamy et al. |
| 9,558,804 B2 | 1/2017 | Mue |
| 9,620,605 B2 | 4/2017 | Liang et al. |
| 9,633,944 B2 | 4/2017 | Kim |
| 9,698,152 B2 | 7/2017 | Peri |
| 9,711,529 B2 | 7/2017 | Hu et al. |
| 9,748,172 B2 | 8/2017 | Takaki |
| 9,786,684 B2 | 10/2017 | Ramaswamy et al. |
| 9,799,761 B2 | 10/2017 | Or-Bach et al. |
| 9,818,468 B2 | 11/2017 | Müller |
| 9,818,848 B2 | 11/2017 | Sun et al. |
| 9,830,969 B2 | 11/2017 | Slesazeck et al. |
| 9,842,651 B2 | 12/2017 | Harari |
| 9,865,680 B2 | 1/2018 | Okumura et al. |
| 9,875,784 B1 | 1/2018 | Li et al. |
| 9,876,018 B2 | 1/2018 | Chavan et al. |
| 9,892,800 B2 | 2/2018 | Harari |
| 9,911,497 B1 | 3/2018 | Harari |
| 9,941,299 B1 | 4/2018 | Chen et al. |
| 10,014,317 B2 | 7/2018 | Peng |
| 10,038,092 B1 | 7/2018 | Chen et al. |
| 10,043,567 B2 | 8/2018 | Slesazeck et al. |
| 10,056,393 B2 | 8/2018 | Schroeder et al. |
| 10,074,667 B2 | 9/2018 | Higashi |
| 10,090,036 B2 | 10/2018 | Van Houdt |
| 10,096,364 B2 | 10/2018 | Harari |
| 10,121,553 B2 | 11/2018 | Harari et al. |
| 10,157,780 B2 | 12/2018 | Wu et al. |
| 10,211,223 B2 | 2/2019 | Van Houdt et al. |
| 10,211,312 B2 | 2/2019 | Van Houdt et al. |
| 10,217,667 B2 | 2/2019 | Or-Bach et al. |
| 10,217,719 B2 | 2/2019 | Watanabe et al. |
| 10,249,370 B2 | 4/2019 | Harari |
| 10,254,968 B1 | 4/2019 | Gazit et al. |
| 10,283,452 B2 | 5/2019 | Zhu et al. |
| 10,283,493 B1 | 5/2019 | Nishida |
| 10,319,696 B1 | 6/2019 | Nakano |
| 10,355,121 B2 | 7/2019 | Or-Bach et al. |
| 10,373,956 B2 | 8/2019 | Gupta et al. |
| 10,381,370 B2 | 8/2019 | Shin et al. |
| 10,381,378 B1 | 8/2019 | Harari |

(56) References Cited

U.S. PATENT DOCUMENTS

| | | | |
|---|---|---|---|
| 10,395,737 B2 | 8/2019 | Harari | |
| 10,403,627 B2 | 9/2019 | Van Houdt et al. | |
| 10,418,377 B2 | 9/2019 | Van Houdt et al. | |
| 10,424,379 B2 | 9/2019 | Slesazeck et al. | |
| 10,431,596 B2 | 10/2019 | Herner et al. | |
| 10,438,645 B2 | 10/2019 | Muell et al. | |
| 10,460,788 B2 | 10/2019 | Mueller | |
| 10,475,812 B2 | 11/2019 | Harari | |
| 10,510,773 B2 | 12/2019 | Ramaswamy et al. | |
| 10,600,808 B2 | 3/2020 | Schröder et al. | |
| 10,608,008 B2 | 3/2020 | Harari et al. | |
| 10,608,011 B2 | 3/2020 | Harari et al. | |
| 10,622,051 B2 | 4/2020 | Mueller et al. | |
| 10,622,377 B2 | 4/2020 | Harari et al. | |
| 10,636,471 B2 | 4/2020 | Ramaswamy et al. | |
| 10,644,826 B2 | 4/2020 | Wuu et al. | |
| 10,650,892 B2 | 5/2020 | Noack | |
| 10,651,153 B2 | 5/2020 | Fastow et al. | |
| 10,651,182 B2 | 5/2020 | Morris et al. | |
| 10,651,196 B1 | 5/2020 | Sharangpani et al. | |
| 10,692,837 B1 | 6/2020 | Nguyen et al. | |
| 10,692,874 B2 | 6/2020 | Harari et al. | |
| 10,700,093 B1 | 6/2020 | Kalitsov et al. | |
| 10,720,437 B2 | 7/2020 | Yoo | |
| 10,725,099 B2 | 7/2020 | Ware | |
| 10,742,217 B2 | 8/2020 | Dabral et al. | |
| 10,825,834 B1 | 11/2020 | Chen | |
| 10,872,905 B2 | 12/2020 | Muel | |
| 10,879,269 B1 | 12/2020 | Zhang et al. | |
| 10,896,711 B2 | 1/2021 | Lee et al. | |
| 10,937,482 B2 | 3/2021 | Sharma et al. | |
| 10,950,616 B2 | 3/2021 | Harari et al. | |
| 10,978,427 B2 | 4/2021 | Li et al. | |
| 11,152,343 B1 | 10/2021 | Dokania et al. | |
| 2001/0030340 A1 | 10/2001 | Fujiwara | |
| 2001/0053092 A1 | 12/2001 | Kosaka et al. | |
| 2002/0012271 A1 | 1/2002 | Forbes | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2003/0038318 A1 | 2/2003 | Forbes | |
| 2004/0000679 A1* | 1/2004 | Patel | H01L 27/105 |
| | | | 257/E27.06 |
| 2004/0043755 A1 | 3/2004 | Shimooka et al. | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2004/0264247 A1 | 12/2004 | Kim | |
| 2005/0128815 A1 | 6/2005 | Ishikawa et al. | |
| 2005/0218509 A1 | 10/2005 | Kipnis et al. | |
| 2005/0236625 A1 | 10/2005 | Schuele et al. | |
| 2005/0280061 A1 | 12/2005 | Lee | |
| 2006/0001083 A1 | 1/2006 | Bhattacharyya | |
| 2006/0080457 A1 | 4/2006 | Hiramatsu et al. | |
| 2006/0140012 A1 | 6/2006 | Wan et al. | |
| 2006/0155921 A1 | 7/2006 | Gorobets et al. | |
| 2006/0212651 A1 | 9/2006 | Ashmore | |
| 2006/0261404 A1 | 11/2006 | Forbes | |
| 2007/0012987 A1 | 1/2007 | McTeer | |
| 2007/0023817 A1 | 2/2007 | Dao | |
| 2007/0045711 A1 | 3/2007 | Bhattacharyya | |
| 2007/0134876 A1 | 6/2007 | Lai et al. | |
| 2007/0192518 A1 | 8/2007 | Rupanagunta et al. | |
| 2007/0236979 A1 | 10/2007 | Takashima | |
| 2008/0022026 A1 | 1/2008 | Yang et al. | |
| 2008/0054346 A1 | 3/2008 | Saitoh et al. | |
| 2008/0160765 A1 | 7/2008 | Lee et al. | |
| 2008/0173930 A1 | 7/2008 | Watanabe | |
| 2008/0178794 A1 | 7/2008 | Cho et al. | |
| 2008/0239812 A1 | 10/2008 | Naofumi et al. | |
| 2008/0266960 A1 | 10/2008 | Kuo | |
| 2008/0291723 A1 | 11/2008 | Wang et al. | |
| 2008/0301359 A1 | 12/2008 | Smith | |
| 2009/0057722 A1 | 3/2009 | Masuoka et al. | |
| 2009/0140318 A1 | 6/2009 | Dong | |
| 2009/0157946 A1 | 6/2009 | Arya | |
| 2009/0237996 A1 | 9/2009 | Kirsch et al. | |
| 2009/0242966 A1 | 10/2009 | Son et al. | |
| 2009/0268519 A1 | 10/2009 | Ishii | |
| 2009/0279360 A1 | 11/2009 | Peter et al. | |
| 2009/0290442 A1 | 11/2009 | Rajan | |
| 2009/0316487 A1 | 12/2009 | Lee et al. | |
| 2010/0013001 A1 | 1/2010 | Cho et al. | |
| 2010/0036960 A1 | 2/2010 | Kowalewski | |
| 2010/0121994 A1 | 5/2010 | Kim et al. | |
| 2010/0124116 A1 | 5/2010 | Takashi et al. | |
| 2010/0128509 A1 | 5/2010 | Kim et al. | |
| 2010/0133541 A1* | 6/2010 | Uchida | H01L 27/1214 |
| | | | 257/E21.414 |
| 2010/0148215 A1 | 6/2010 | Schulze et al. | |
| 2010/0207185 A1 | 8/2010 | Lee et al. | |
| 2010/0213527 A1 | 8/2010 | Shim et al. | |
| 2010/0219392 A1 | 9/2010 | Awaya et al. | |
| 2010/0254191 A1 | 10/2010 | Son et al. | |
| 2010/0327413 A1 | 12/2010 | Lee et al. | |
| 2011/0003418 A1 | 1/2011 | Sakata et al. | |
| 2011/0044113 A1 | 2/2011 | Kim | |
| 2011/0047325 A1 | 2/2011 | Mishima | |
| 2011/0115011 A1 | 5/2011 | Masuoka et al. | |
| 2011/0134705 A1 | 6/2011 | Jones et al. | |
| 2011/0140107 A1* | 6/2011 | Kang | H01L 27/1214 |
| | | | 257/E21.41 |
| 2011/0143519 A1 | 6/2011 | Lerner | |
| 2011/0156165 A1* | 6/2011 | Jang | H01L 27/1214 |
| | | | 257/389 |
| 2011/0156995 A1* | 6/2011 | Choi | H01L 27/12 |
| | | | 257/E21.409 |
| 2011/0170266 A1 | 7/2011 | Haensh et al. | |
| 2011/0208905 A1 | 8/2011 | Shaeffer et al. | |
| 2011/0291176 A1 | 12/2011 | Lee et al. | |
| 2011/0298013 A1 | 12/2011 | Hwang et al. | |
| 2011/0310683 A1 | 12/2011 | Gorobets | |
| 2012/0063223 A1 | 3/2012 | Lee | |
| 2012/0074478 A1 | 3/2012 | Sugimachi | |
| 2012/0146126 A1 | 6/2012 | Lai et al. | |
| 2012/0182801 A1 | 7/2012 | Lue | |
| 2012/0208347 A1 | 8/2012 | Hwang et al. | |
| 2012/0223380 A1 | 9/2012 | Lee et al. | |
| 2012/0243314 A1 | 9/2012 | Takashi | |
| 2012/0307568 A1 | 12/2012 | Banna et al. | |
| 2012/0327714 A1 | 12/2012 | Lue | |
| 2013/0007349 A1 | 1/2013 | D'Abreu et al. | |
| 2013/0031325 A1 | 1/2013 | Nakamoto et al. | |
| 2013/0256780 A1 | 10/2013 | Kai et al. | |
| 2013/0267046 A1 | 10/2013 | Or-Bach et al. | |
| 2013/0337646 A1* | 12/2013 | Cernea | G11C 5/025 |
| | | | 438/666 |
| 2014/0015036 A1 | 1/2014 | Fursin et al. | |
| 2014/0040698 A1 | 2/2014 | Loh et al. | |
| 2014/0070290 A1 | 3/2014 | Inumiya et al. | |
| 2014/0075135 A1 | 3/2014 | Choi et al. | |
| 2014/0112075 A1 | 4/2014 | Dunga et al. | |
| 2014/0117366 A1 | 5/2014 | Saitoh | |
| 2014/0151774 A1 | 6/2014 | Rhie | |
| 2014/0173017 A1 | 6/2014 | Takagi et al. | |
| 2014/0213032 A1 | 7/2014 | Kai et al. | |
| 2014/0229131 A1 | 8/2014 | Cohen et al. | |
| 2014/0247674 A1 | 9/2014 | Karda et al. | |
| 2014/0252454 A1 | 9/2014 | Rabkin | |
| 2014/0252532 A1* | 9/2014 | Yang | H01L 21/265 |
| | | | 257/503 |
| 2014/0284691 A1* | 9/2014 | Takamura | H10B 43/35 |
| | | | 438/287 |
| 2014/0328128 A1 | 11/2014 | Louie et al. | |
| 2014/0340952 A1 | 11/2014 | Ramaswamy et al. | |
| 2014/0355328 A1 | 12/2014 | Müller et al. | |
| 2015/0054507 A1 | 2/2015 | Gulaka et al. | |
| 2015/0079743 A1 | 3/2015 | Pachamuthu et al. | |
| 2015/0079744 A1* | 3/2015 | Hwang | H10B 12/053 |
| | | | 438/268 |
| 2015/0098272 A1 | 4/2015 | Kasolra et al. | |
| 2015/0113214 A1 | 4/2015 | Sutardja | |

(56) References Cited

U.S. PATENT DOCUMENTS

| | | |
|---|---|---|
| 2015/0129955 A1 | 5/2015 | Mueller et al. |
| 2015/0155876 A1 | 6/2015 | Jayasena et al. |
| 2015/0187823 A1* | 7/2015 | Miyairi .................. H01L 29/24 257/43 |
| 2015/0194440 A1 | 7/2015 | Noh et al. |
| 2015/0206886 A1* | 7/2015 | Guha .................... H10B 12/09 438/239 |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0340096 A1* | 11/2015 | Shim ..................... G11C 5/063 365/185.11 |
| 2015/0340371 A1 | 11/2015 | Lui |
| 2015/0347331 A1 | 12/2015 | Park et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0049404 A1* | 2/2016 | Mariani ............ H01L 29/42364 257/329 |
| 2016/0086953 A1* | 3/2016 | Liu ...................... H01L 21/762 438/268 |
| 2016/0086970 A1 | 3/2016 | Peng |
| 2016/0104534 A1* | 4/2016 | Chen .................... H01L 27/092 257/316 |
| 2016/0118404 A1 | 4/2016 | Peng |
| 2016/0141294 A1 | 5/2016 | Peri et al. |
| 2016/0225860 A1 | 8/2016 | Karda et al. |
| 2016/0248631 A1 | 8/2016 | Duchesneau |
| 2016/0276360 A1 | 9/2016 | Doda et al. |
| 2016/0300724 A1 | 10/2016 | Levy et al. |
| 2016/0314042 A1 | 10/2016 | Plants |
| 2016/0321002 A1 | 11/2016 | Jung et al. |
| 2016/0358934 A1 | 12/2016 | Lin et al. |
| 2017/0053906 A1 | 2/2017 | Or-Bach et al. |
| 2017/0062456 A1 | 3/2017 | Sugino et al. |
| 2017/0092370 A1 | 3/2017 | Harari |
| 2017/0092371 A1 | 3/2017 | Harari |
| 2017/0140807 A1 | 5/2017 | Sun et al. |
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0006044 A1 | 1/2018 | Chavan et al. |
| 2018/0095127 A1 | 4/2018 | Pappu et al. |
| 2018/0108416 A1 | 4/2018 | Harari |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0357165 A1 | 12/2018 | Helmick et al. |
| 2018/0366471 A1 | 12/2018 | Harari et al. |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0019564 A1 | 1/2019 | Li et al. |
| 2019/0028387 A1 | 1/2019 | Gray |
| 2019/0067327 A1 | 2/2019 | Herner et al. |
| 2019/0121699 A1 | 4/2019 | Cohen et al. |
| 2019/0130946 A1 | 5/2019 | Sim et al. |
| 2019/0148286 A1 | 5/2019 | Or-Bach et al. |
| 2019/0157296 A1 | 5/2019 | Harari et al. |
| 2019/0171391 A1 | 6/2019 | Dubeyko et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0237470 A1 | 8/2019 | Mine et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0332321 A1 | 10/2019 | Chen |
| 2019/0319044 A1 | 11/2019 | Harari |
| 2019/0348424 A1 | 11/2019 | Karda et al. |
| 2019/0348437 A1 | 11/2019 | Fukuzumi et al. |
| 2019/0355672 A1 | 11/2019 | Fujita et al. |
| 2019/0355747 A1 | 11/2019 | Herner et al. |
| 2019/0370005 A1 | 12/2019 | Moloney et al. |
| 2019/0370117 A1 | 12/2019 | Fruchtman et al. |
| 2019/0384884 A1 | 12/2019 | Thuries et al. |
| 2020/0006306 A1 | 1/2020 | Li |
| 2020/0020718 A1 | 1/2020 | Harari et al. |
| 2020/0051990 A1 | 2/2020 | Harari et al. |
| 2020/0065647 A1 | 2/2020 | Mulaosmanovic et al. |
| 2020/0075631 A1 | 3/2020 | Dong |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0176475 A1 | 6/2020 | Harari |
| 2020/0185411 A1 | 6/2020 | Hierner et al. |
| 2020/0194416 A1 | 6/2020 | Or-Bach et al. |
| 2020/0201718 A1 | 6/2020 | Richter et al. |
| 2020/0203378 A1 | 6/2020 | Harari et al. |
| 2020/0219572 A1 | 7/2020 | Harari |
| 2020/0227123 A1 | 7/2020 | Salahuddin et al. |
| 2020/0243486 A1 | 7/2020 | Quader et al. |
| 2020/0258897 A1 | 8/2020 | Yan et al. |
| 2020/0326889 A1 | 10/2020 | Norman et al. |
| 2020/0341838 A1 | 10/2020 | Hollis |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0388313 A1 | 12/2020 | Cho et al. |
| 2020/0388711 A1 | 12/2020 | Doyle et al. |
| 2020/0395328 A1 | 12/2020 | Fastow et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |
| 2021/0074726 A1 | 3/2021 | Lue |
| 2021/0111179 A1 | 4/2021 | Shivaraman et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2022/0028876 A1 | 1/2022 | Purayath et al. |
| 2022/0028886 A1 | 1/2022 | Pur et al. |
| 2022/0043596 A1 | 2/2022 | Madraswala et al. |

FOREIGN PATENT DOCUMENTS

| | | |
|---|---|---|
| JP | 2000339978 A | 12/2000 |
| JP | 2004079606 A | 3/2004 |
| JP | 2006099827 A1 | 4/2006 |
| JP | 2009206451 A1 | 9/2009 |
| JP | 2010108522 A1 | 5/2010 |
| JP | 2010251572 A | 11/2010 |
| JP | 2011028540 A1 | 2/2011 |
| KR | 20120085591 A1 | 8/2012 |
| KR | 20120085603 A | 8/2012 |
| WO | 2015025357 A1 | 2/2015 |
| WO | 2018236937 A1 | 12/2018 |
| WO | 2019066948 A1 | 4/2019 |

OTHER PUBLICATIONS

Kunitake, Hitoshi , et al., "High-temperature Electrical Characteristics of 60nm CAAC-IGZO FET : Comparison with Si FET", International Conference on Solid State Devices and Materials, https://doi.org/10.7567/SSDM.2018.N-3-04, Sep. 2018, pp. 787-788.

(56) References Cited

OTHER PUBLICATIONS

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young, et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J., et al., "Characterization of Fatigue and Its Recovery Behavior in Ferroelectric HfZrO", 2021 Symposium on VLSI Technology, Jun. 2021, 2 p.

Liao, C.Y., et al., "Multibit Ferroelectric FET Based on Nonidentical Double HfZrO2 for High-Density Nonvolatile Memory", IEEE Electron Device Letters, vol. 42, No. 4, doi: 10.1109/LED.2021.3060589., Apr. 2021, pp. 617-620.

Lue, H.T., et al., "A Highly Scalable 8-Layer 3D Vertical-gate {Vg} TFT NANO Flash Using Junction-Free Buried Channel BE-SONOS Device", Symposium on VLSI: Tech. Dig. Of Technical Papers, 2010, pp. 131-132.

Materano, Monica, et al., "Interplay between oxygen defects and dopants: effect on structure and performance of HfO2-based ferroelectrics", Inorg. Chem. Front. (8), Apr. 9, 2021, pp. 2650-2672.

Mo, Fei, et al., "Experimental Demonstration of Ferroelectric HfO2 FET with Ultrathin-body IGZO for High-Density and Low-Power Memory Application", 2019 Symposium on VLSI Technology, 3, doi: 10.23919/VLSIT.2019.8776553., 2019, pp. T42-T4.

Mo, Fei, et al., "Experimental Demonstration of Ferroelectric HfO2 FET with Ultrathin-body IGZO for High-Density and Low-Power Memory Application", Symposium on VLSI Technology, 2019, pp. T42-T43, doi: 10.23919/VLSIT.2019.8776553., Jul. 13, 2020, 7 pages.

Mo, Fei, et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S., et al., "Development Status of Gate-First FeFET Technology", 2021 Symposium on VLSI Technology, Jun. 2021, 2 pages.

Mueller, J., et al., "Ferroelectric Hafnium Oxide Based Materials and Devices: Assessment of Current Status and Future Prospects", ECS Journal of Solid State Science and Technology, 4 (5) N30-N35 (2015), Feb. 21, 2015, pp. N29-N35.

Mueller, J., et al., "Ferroelectric hafnium oxide: A CMOS-compatible and highly scalable approach to future ferroelectric memories", IEEE International Electron Devices Meeting, Washington, DC, USA, doi: 10.1109/IEDM.2013.6724605., 2013, pp. 10.8.1-10.8.4.

Mueller, Stephen, et al., "From MFM Capacitors Toward Ferroelectric Transistors: Endurance and Disturb Characteristics of HfO2-Based FeFET Devices", IEEE Transactions on Electron Devices, vol. 60, No. 12, doi: 10.1109/TED.2013.2283465., Dec. 2013, pp. 4199-4205.

Müller, J., et al., "Ferroelectric hafnium oxide: A CMOS-compatible and highly scalable approach to future ferroelectric memories", 2013 IEEE International Electron Devices Meeting, Washington, DC, USA, doi: 10.1109/IEDM.2013.6724605., 2013, pp. 10.8.1-10.8.4.

Nguyen, Manh-Cuong, et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.

On, Nuri, et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Onuki, Tatsuya, et al., "Embedded memory and ARM Cortex-M0 core using 60-nm C-axis aligned crystalline Indium-gallium-zinc oxide FET integrated with 65-nm Si CMOS", IEEE Journal of Solid-State Circuits, vol. 52, No. 4,, Apr. 2017, pp. 925-932.

Park, Goon-Ho, et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.

Rios, Rafael, et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Rzehak, Volker, "Low-Power FRAM Microcontrollers and Their Applications", Texas Instruments White Paper, SLAA502, Jul. 2019, 7 pages.

Saitoh, Masumi, et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, p. 18.1.1-18.1.4.

Saitoh, Masumi, et al., "HfO2-based FeFET and FTJ for Ferroelectric-Memory Centric 3D LSI towards Low-Power and High-Density Storage and AI Applications", IEEE International Electron Devices Meeting (IEDM), doi: 10.1109/IEDM13553.2020.9372106., 2020, pp. 18.1.1-18.1.4.

Salahuddin, Sayeef, et al., "FeFETs for Near-Memory and In-Memory Compute", 2021 IEEE International Electron Devices Meeting (IEDM), Department of Electrical Engineering and Computer Sciences, Dec. 2021, 4 pages.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Sheng, Jiazhen, et al., "Review Article: Atomic layer deposition for oxide semiconductor thin film transistors: Advances in research and development", J. Vac. Sci. Technol. A 36, 060801, https://doi.org/10.1116/1.5047237., Nov. 2, 2018, 14 pages.

Si, Mengwei, et al., "Why In2O3 Can Make 0.7 nm Atomic Layer Thin Transistors?", https://arxiv.org/ftp/arxiv/papers/2012/2012.12433.pdf., 2012, 26 pages.

Si, Mengwei, et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Su, Nai-Chao, et al., "A Nonvolatile InGaZnO Charge-Trapping-Engineered Flash Memory With Good Retention Characteristics", IEEE Electron Device Letters, vol. 31, No. 3, Mar. 2010, pp. 201-203.

Sun, Chen, "First Demonstration of BEOL-Compatible Ferroelectric TCAM Featuring a-IGZO Fe-TFTs with Large Memory Window of 2.9 V, Scaled Channel Length of 40 nm, and High Endurance of 10/\8 Cycles", 2021 Symposium on VLSI Technology Digest of Technical Papers, Kyoto, doi: 978-4-86348-779-6., Jun. 2021, 2 pages.

Tan, Ava J., et al., "A Nitrided Interfacial Oxide for Interface State Improvement in Hafnium Zirconium Oxide-Based Ferroelectric Transistor Technology", IEEE Electron Device Letters, vol. 39, No. 1, doi: 10.1109/LED.2017.2772791., Jan. 2018, pp. 95-98.

Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.

Tan, Ava Jiang, et al., "Ferroelectric HfO2 Memory Transistors with High-K Interfacial Layer and Write Endurance Exceeding 1010 Cycles", arXiv:2103.08806 [physics.app-ph], available at https://arxiv.org/abs/2103.08806., Mar. 16, 2021.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

(56) References Cited

OTHER PUBLICATIONS

Tan, Yan-Ny, et al., "Over-Erase Phenomenon in SONOS-Type Flash Memory and its Minimization Using a Hafnium Oxide Charge Storage Layer", IEEE Transactions On Electron Devices, vol. 51, No. 7, Jul. 2004, pp. 1143-1147.
Tanaka, T., et al., "A 768 Gb 3b/cell 3D-Floating-Gate NANO Flash Memory", Digest of Technical Papers, the 2016 EEE International Solid-Slate Circuits Conference, 2016, pp. 142-144.
Van Houdt, Jan, "The 3D FeFET: contender for 3D-NAND Flash memory and machine learning", available at https://www.imec-int.com/en/imec-magazine/imec-magazine-october-2017/the-vertical-ferroelectric-fet-a-new-contender-for-3d-nand-flash-memory-and-machine-learning, Sep. 30, 2019, 8 pages.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
Yang, Jin, et al., "Highly Optimized Complementary Inverters Based on p-SnO and n-InGaZnO With High Uniformity", IEEE Electron Device Letters, vol. 39, No. 4, doi: 10.1109/LED.2018.2809796., Apr. 2018, pp. 516-519.
"EP Extended Search Report EP168690149.3", dated Oct. 18, 2019.
"European Search Report, EP 16852238.1", dated Mar. 28, 2019.
"European Search Report, EP17844550.8", dated Aug. 12, 2020, 11 pages.
"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.
"Invitation to Pay Additional Fees (PCT/ISA/206), PCT/US2020/015710", dated Mar. 20, 2020, 2 pages.
"Invitation to Pay Additional Fees, PCT/US2019/065256", dated Feb. 13, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2018/067338", dated May 8, 2019.
"PCT Search Report and Written Opinion, PCT/US2019/014319", dated Apr. 15, 2019.
"PCT Search Report and Written Opinion, PCT/US2019/041678", dated Oct. 9, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2019/065256", dated Apr. 14, 2020.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
"PCT Search Report and Written Opinion, PCT/US2020/065374", dated Mar. 15, 2021, 17 pages.
"PCT Search Report and Written Opinion, PCT/US2020/065670", dated Apr. 5, 2021, 12 pages.
"PCT Search Report and Written Opinion, PCT/US2021/016964", dated Jun. 15, 2021, 19 pages.
"PCT Search Report and Written Opinion, PCT/US2021/025722", dated Jun. 15, 2021, 10 pages.
"PCT Search Report and Written Opinion, PCT/US2021/042607", dated Nov. 4, 2021, 17 pages.
"PCT Search Report and Written Opinion, PCT/US2021/047803", dated Nov. 23, 2021, 15 pages.
"PCT Search Report and Written Opinion, PCT/US2021/064844", dated Mar. 8, 2022, 15 paged.
"PCT Search Report and Written Opinion, PCT/US2021/42620", dated Oct. 28, 2021, 18 pages.
"PCT Search Report and Written Opinion, PCT/US2022/016729", Applicant: SunRise Memory Corporation, dated May 17, 2022, 20 pages.
"PCT Search Report and Written Opinion, PCT/US2022/15497", dated Jul. 11, 2022, 20 pages.
Ahn, Min-Ju, et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.
Alessandri, Cristobal, et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.
Ali, T., et al., "A Multilevel FeFET Memory Device based on Laminated HSO and HZO Ferroelectric Layers for High-Density Storage", IEEE International Electron Devices Meeting (IEDM), 2019, doi: 10.1109/IEDM19573.2019.8993642., Dec. 2019, pp. 28.7.1-28.7.4.
Ali, T., et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.— paper cited in Bae (Berkeley) paper, Sep. 2018, pp. 3769-3774.
Bae, Jong-Ho, et al., "Highly Scaled, High Endurance, Ω-Gate, Nanowire Ferroelectric FET Memory Transistors", IEEE Electron Device Letters, vol. 41, No. 11, doi: 10.1109/LED.2020.3028339.— Sayeef-Berkeley paper on FeFET memory, Nov. 2020, pp. 1637-1640.
Beyer, Sven, et al., "FeFET: A versatile CMOS compatible device with game-changing potential", IEEE International Memory Workshop (IMW), doi: 10.1109/IMW48823.2020.9108150., 2020, pp. 1-4.
Böscke, T.S., et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.
Chang, Sou-Chi, et al., "Anti-ferroelectric $Hf_xZr_{1-x}O_2$ Capacitors for High-density 3-D Embedded-DRAM", IEEE International Electron Devices Meeting (IEDM), doi: 10.1109/IEDM13553.2020.9372011., 2020, pp. 28.1.1-28.1.4.
Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.
Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.
Choi, Seonjun, et al., "A novel three-dimensional NAND flash structure for improving the erase performance", IEICE Electronics Express, 2019 vol. 16 Issue 3, 2019, 6 pages.
De, Sourav, et al., "Ultra-Low Power Robust 3bit/cell $Hf_{0.5}Zr_{0.5}O_2$ Ferroelectric FinFET with High Endurance for Advanced Computing-In-Memory Technology", 2021 Symposium on VLSI Technology, Kyoto, Japan, Jun. 13-19, 2021, Jun. 2021, 2 pages.
Dünkel, "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.
Dutta, Sourav, et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.
Florent, K., "First demonstration of vertically stacked ferroelectric Al doped $HfO_2$ devices for NAND applications", Symposium on VLSI Technology, doi: 10.23919/VLSIT.2017.7998162., 2017, pp. T158-T159.
Florent, K., et al., "Vertical Ferroelectric $HfO_2$ FET based on 3-D Nand Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.

(56) References Cited

OTHER PUBLICATIONS

Hendy, Ian, "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Hisain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.

Jeewandara, Thamarasee, et al., "High-speed 3-D memory with ferroelectric NAND flash memory", available at https://techxplore.com/news/2021-01-high-speed-d-memoryferroelectric-nand.html, Jan. 26, 2021, 5 pages.

Kawai, H., et al., "Design Principle of Channel Material for Oxide-Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.

Kim, Min-Kyu, et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.

Kim, Taeho, et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.

\* cited by examiner

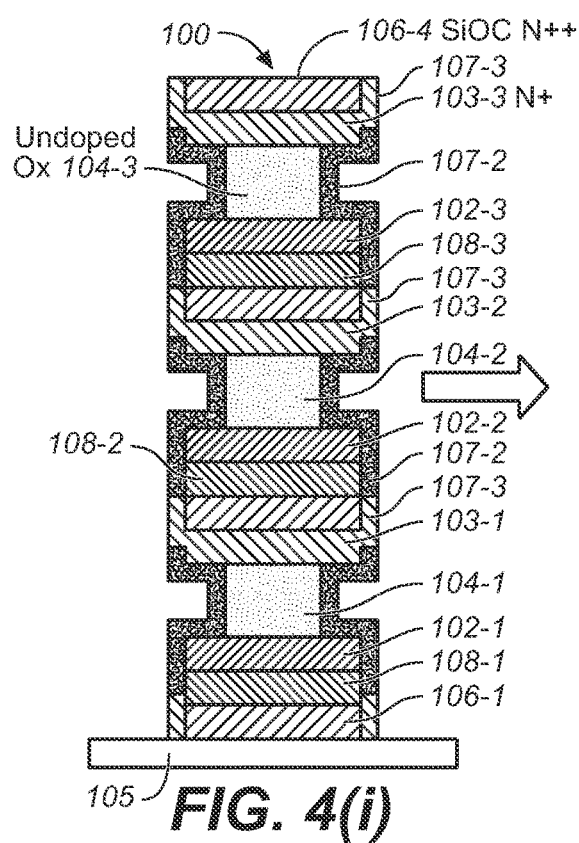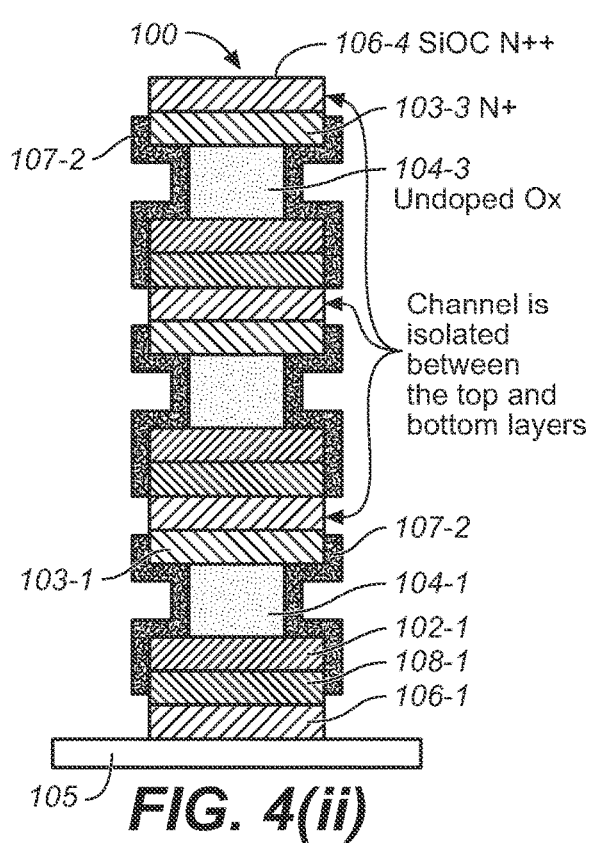

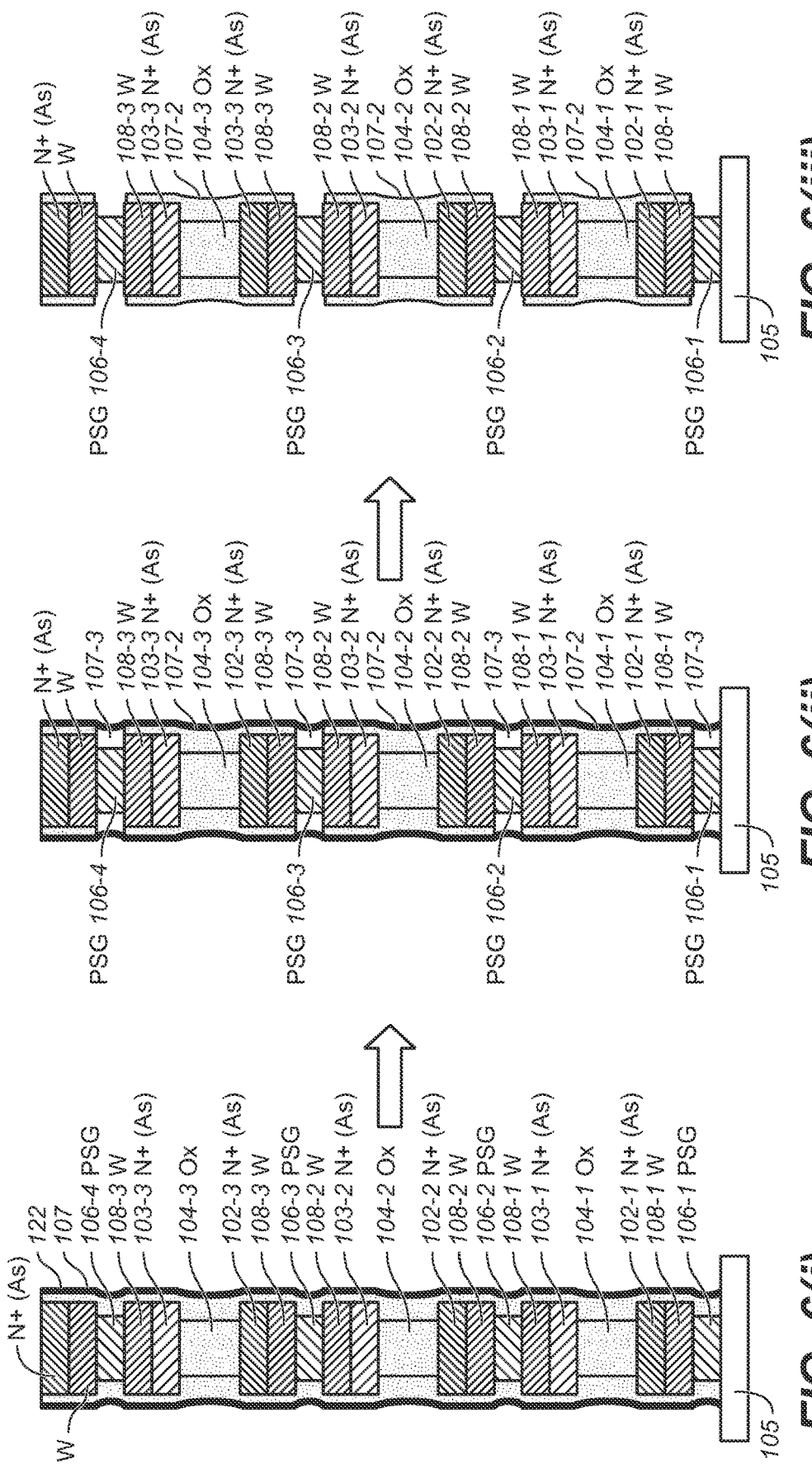

PROCESS FOR PREPARING A CHANNEL REGION OF A THIN-FILM TRANSISTOR IN A 3-DIMENSIONAL THIN-FILM TRANSISTOR ARRAY

CROSS REFERENCE TO RELATED APPLICATIONS

The present application is a continuation application of U.S. patent application ("Parent Application"), Ser. No. 17/125,477, entitled "PROCESS FOR PREPARING A CHANNEL REGION OF A THIN-FILM TRANSISTOR IN A 3-DIMENSIONAL THIN-FILM TRANSISTOR ARRAY," filed on Dec. 17, 2020, which is related to and claims priority of U.S. provisional patent application ("Provisional Application") Ser. No. 62/950,390, entitled "PROCESS FOR PREPARING A CHANNEL REGION OF A THIN-FILM TRANSISTOR IN A 3-DIMENSIONAL THIN-FILM TRANSISTOR ARRAY," filed on Dec. 19, 2019.

The disclosures of the Parent Application and the Provisional Application are hereby incorporated by reference in its entirety.

BACKGROUND OF THE INVENTION

1. Field of the Invention

The present invention relates to the processes used in manufacturing semiconductor circuits. In particular, the present invention relates to processes used in manufacturing 3-dimensional arrays of thin-film transistors, such as thin-film memory transistors.

2. Discussion of the Related Art 3-dimensional arrays of thin-film memory cells have been described, for example, in U.S. Pat. No. 10,121,553, entitled "Capacitive-Coupled Non-Volatile Thin-Film Transistor NOR Strings In 3-Dimensional Arrays," issued on Nov. 6, 2018. The '553 patent discloses a 3-dimensional array of NOR-type memory strings in which each NOR-type memory string comprises thin-film memory transistors formed along a horizontal strip of semiconductor materials, with each strip of semiconductor materials comprising a horizontal layer of channel material between two horizontal conductive semiconductor layers. The conductive semiconductor layers form a common drain region and a common source region, respectively, for the thin-film transistors of the NOR-type memory string.

The detailed description below refers to thin-film transistors formed above a planar surface of a semiconductor substrate. The terms "horizontal" and "vertical" refer to a direction substantially parallel and substantially orthogonal to the planar surface, respectively. For illustrative purpose, the X-direction and the Y-direction refer to two orthogonal directions parallel to the planar surface, and the Z-direction is orthogonal to both the X-direction and the Y-directions.

FIG. 1(a) shows structure 100 of a 3-dimensional thin-film transistor array at an intermediate step of formation. FIG. 1(a) is a vertical cross-section of structure 100. As shown in FIG. 1(a), structure 100 shows active stacks 101-1, 101-2 and 101-3—which are three of numerous parallel active stacks of semiconductor strips—separated from each other by trenches 109. In FIG. 1(a), each active stack includes a selected number of active strips 110 each isolated from its neighbors by isolation layers 106 (e.g., isolation layers 106-2 and 106-3 isolating active strip 110-2 from active strips 110-1 and 110-3). (The active stacks are arranged along the X-direction, each extending lengthwise along the Y-direction; each active strip also extends lengthwise along the Y-direction and are stacked along the Z-direction.) Also, in this detailed description, when a material or layer is generally referred to by a first reference numeral (e.g., n), specific instances of the material or layer are distinguished by a second reference numeral hyphenated to the first reference numeral (e.g., n-1, n-2, etc.).

In one implementation, each active stack includes eight active strips 110-1, 110-2, ..., 110-8. For convenience of illustration only three active strips (e.g., active strips 110-1, 110-2 and 110-3) are shown for each of active stacks 101-1, 101-2, and 101-3. Generally, in a 3-dimensional thin-film transistor array, any suitable number of active stacks (e.g., 1, 2, 4, 16, 32, 64, 128, ...) and any suitable number of active strips (e.g., 1, 2, 4, 8, 16, ...) may be provided. In FIG. 1(a), the active strips (e.g., 5-nm-wide each) are isolated from each other by isolation layers 106 (e.g., isolation layers 106-1, 106-2, and 106-3). Each active strip includes common drain region, a common drain region and a body oxide layer in between (e.g., in active strip 110-1, common drain region 102-1, common source region 103-1 and body oxide layer 104-1). Each common drain region is also provided an adjacent metal layer to reduce resistance along its length (e.g., common drain region 102-1 is in contact with metal layer 108-1, such as tungsten). In some implementation, a sacrificial SiN layer stands in for metal layer 108-1, which is replaced by the metal at a subsequent step.

In a prior step, body oxide layers 104 (e.g., body oxide layers 104-1, 104-2 and 104-3) are isotropically etched to recess from the sidewalls of trenches 109. Thereafter, an intrinsic or lightly doped semiconductor material ("channel semiconductor material") is conformally deposited on the sidewalls of trenches 109. This channel semiconductor material, shown in FIG. 1(a) as layers 107, for example, are intended to serve as channel regions between the common drain region and the common source region for the thin-film storage transistors in each active strip.

To create the channel regions, a separation etch—typically an anisotropic etch—is subsequently carried out to remove the channel semiconductor material from the sidewalls of trench 109, without damaging the channel semiconductor material that has been deposited in the recesses over body oxide layers 104. FIG. 1(b) shows one instance of resulting structure 100 after a separation etch. However, because the separation etch has a high aspect-ratio (e.g., trenches 109 may each be 60-nm wide and 2-um deep), the channel semiconductor material adjacent the body oxide layer often becomes too thin due to sideway etching, as indicated by arrow A, and leaves undesirable stringers towards the bottom of trenches 109, as indicated by arrow B. Both excessive thinning of the channel semiconductor material adjacent the body oxide layer and leaving stringers on the sidewalls of the trenches are undesirable. Also, if metal layers 108 have already been provided, the anisotropic etch may sputter the metal to result in contamination.

SUMMARY

According to one embodiment of the present invention, a process includes (a) providing a semiconductor substrate having a planar surface; (b) forming a plurality of thin-film layers above the planar surface of the semiconductor substrate, one on top of another, including among the thin-film layers first and second isolation layers, wherein a significantly greater concentration of a first dopant specie is provided in the first isolation layer than in the second isolation layer; (c) etching along a direction substantially orthogonal to the planar surface through the thin-films to create a trench having sidewalls that expose the thin-film layers; (d) depositing conformally a semiconductor material (e.g., an amorphous silicon and a polysilicon) on the sidewalls of the trench; (e) annealing the first isolation layer at a predetermined temperature and a predetermined duration such that the first isolation layer act as a source of the first dopant specie which dopes a portion of the semiconductor material adjacent the first isolation layer; and (f) selectively etching (e.g., wet or dry etch) the semiconductor material to remove the doped portion of the semiconductor material without removing the remainder of the semiconductor material. The process may also include etching the thin-film layers such that the first isolation layer recesses from the sidewalls of the trench.

In one embodiment, the first isolation layer may include an organosilicon layer (e.g., SiOCH or SiOC), a silicon nitride layer or a silicate glass (e.g., BSG or PSG), and (ii) the selective etching uses an etchant that that may include tetra-methyl ammonium hydroxide (TMAH), potassium hydroxide (KOH), or ethylene diamine and pyrocatechol (EDP). In these cases, the annealing step may include a rapid thermal annealing step, and wherein the predetermined temperature is between 650° C. and 820° C., preferably about 750° C.

In another embodiment, the first isolation layer may be carbon-doped with a carbon dopant concentration of about $10^{20}$ cm$^{-3}$ or greater, and the selective etching uses an etchant that comprises ethylene diamine and pyrocatechol (EDP). In that case, the annealing step comprises a rapid thermal annealing step, and the predetermined temperature is between about 600° C. and about 820° C., preferably about 750° C.

In yet another embodiment, an additional material that is highly doped with a second dopant may be deposited adjacent and over the semiconductor material. An annealing step diffuses the second dopant specie into the semiconductor material, so as to adjust an effective dopant concentration in the semiconductor material. That effective dopant concentration may determine a threshold voltage of a thin-film transistor in which the semiconductor material serve as a channel region. In some embodiments, the first dopant specie may be boron and the second dopant specie may be phosphorus, or vice versa.

In yet another embodiment, the first isolation layer includes an organosilicon layer (e.g., BSG or PSG, with a dopant concentration greater than $1.0 \times 10^{22}$ cm$^{-3}$), a silicon nitride layer or a silicate glass, and the selective etching uses an etchant that may include atomic chlorine, HF (gaseous or in an aqueous solution) or a fluorocarbon gas. In this case, the annealing step may include a rapid thermal annealing step, and the predetermined temperature is between about 600° C. and about 820° C., preferably about 750° C. A suitable aqueous HF solution may include HF, nitric acid and acetic acid, in various suitable proportions. A capping layer may be deposited over the conformally deposited semiconductor material.

The present invention is better understood upon consideration of the detailed description below in conjunction with the accompanying drawings.

BRIEF DESCRIPTION OF THE DRAWINGS

FIGS. 4(i) and (ii) illustrate an alternatively embodiment of the present invention, in which isolation layers 106 dope their adjacent channel semiconductor material 107 for selective removal, in accordance with one embodiment of the present invention.

FIGS. 6(i), 6(ii) and 6(iii) illustrate a third alternatively embodiment of the present invention, in which isolation layers 106 dope their adjacent channel semiconductor material 107 for selective removal, in accordance with one embodiment of the present invention.

DETAILED DESCRIPTION OF THE PREFERRED EMBODIMENTS

The present invention avoids both the excessive thinning of the channel semiconductor material adjacent the body oxide layer and the stringers on the sidewalls of the trenches. Rather than depending on the directionality of the separation etch, the methods of the present invention chemically convert either the portions of the channel semiconductor material in the recesses adjacent the body oxide layers, or the portions of the channel semiconductor material on the sidewalls of the trenches, or both, such that a subsequent etch may selectively removes the portions of the channel semiconductor material from the sidewalls of the trenches.

Figure 1A:
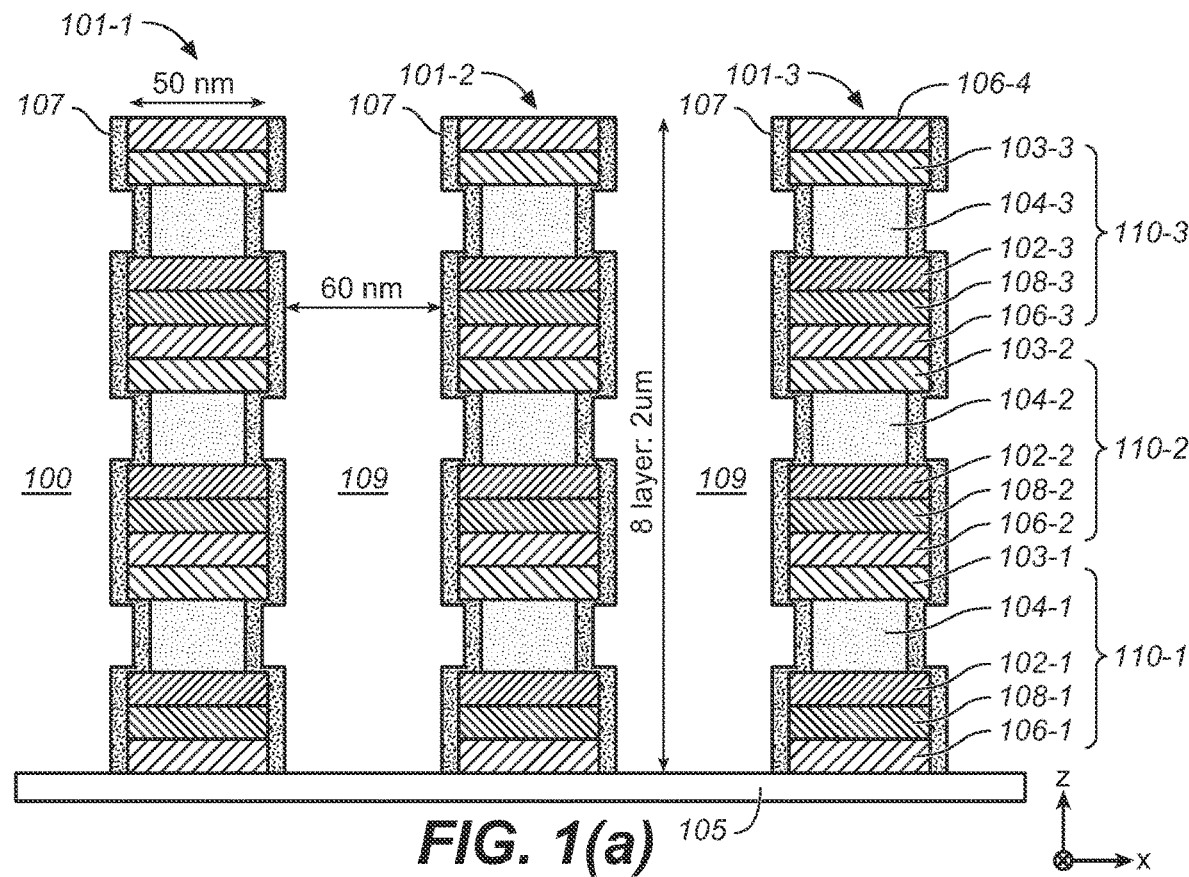
FIG. 1(a) shows structure 100 of a 3-dimensional thin-film transistor array at an intermediate step of formation.
Figure 2A:
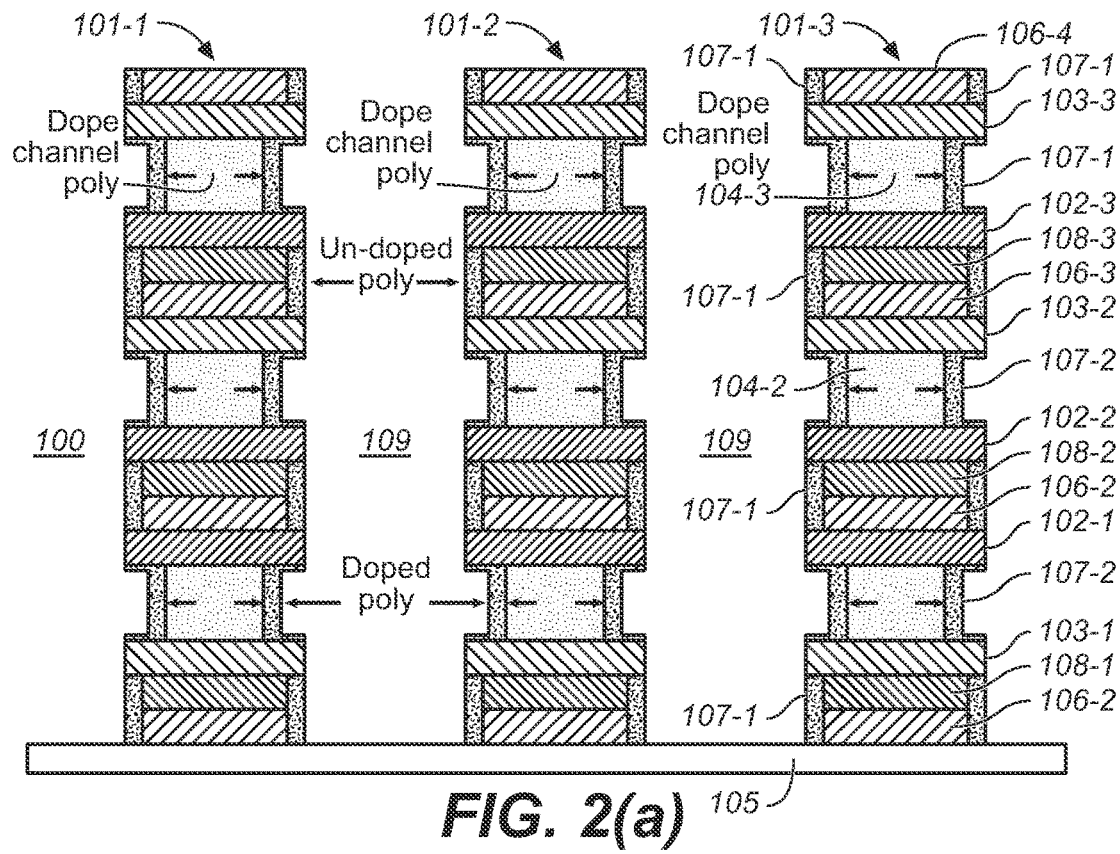
FIG. 2(a) show the resulting structure 100, in which the portions of channel semiconductor material 107 on the sidewalls of trenches 109 are designated 107-1, while the boron-doped portions of the channel semiconductor material 107 adjacent body oxide layers 104 are designated 107-2, in accordance with one embodiment of the present invention.
Figure 2B:
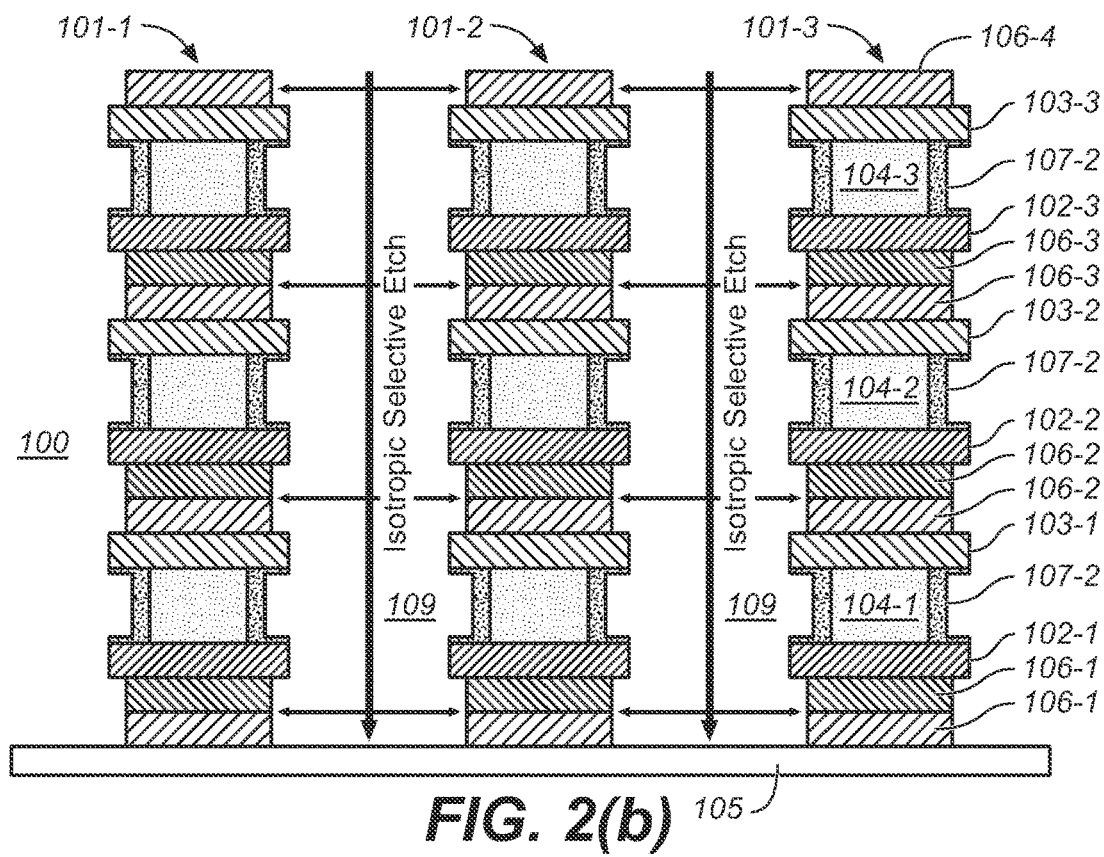
FIG. 2(b) shows the resulting structure 100 after a selective etch using an etchant has a significantly different etch rate between undoped polysilicon and doped silicon of a predetermined dopant concentration or greater.

According to a first embodiment of the present invention, body oxide layers 104 of structure 100 of FIG. 1(a) is heavily boron-doped (i.e., p$^+$-type), as deposited, while common drain regions 102 and common source regions 103 are arsenic-doped (i.e., n$^+$-type). In this embodiment, body oxide layer 104 may be, for example, a 50-nm thick organosilicon layer (e.g., SiOCH) with a dopant concentration of about $1.0 \times 10^{20}$ cm$^{-3}$ or greater. After conformal deposition of channel semiconductor material layers 107 (e.g., intrinsic polysilicon), an annealing step (e.g., a rapid thermal annealing (RTA) step at 750° C. for 10 min.) is carried out. As a result of the annealing step, boron from body oxide layers 104 out-diffuses into their adjacent portions of channel semiconductor material 107, resulting in a dopant concentration in those portions of, for example, between about $5.0 \times 10^{18}$ cm$^{-3}$ and about $1.0 \times 10^{19}$ cm$^{-3}$. During this time, some amount of arsenic may also out-diffuse from common drain layers 102 and common source layers 103 into their respective adjacent portions of channel semiconductor material 107. However, as boron has a much higher diffusion rate than arsenic above 650° C., the arsenic diffusion is relatively inconsequential. FIG. 2(*a*) show the resulting structure 100, in which the portions of channel semiconductor material 107 on the sidewalls of trenches 109 are designated 107-1, while the boron-doped portions of the channel semiconductor material 107 adjacent body oxide layers 104 are designated 107-2.

A selective etch using, for example, tetra-methyl ammonium hydroxide (TMAH) may be used to remove channel semiconductor material 107-1 from the sidewalls of trenches 109, leaving behind channel semiconductor material 107-2 in the recesses of body oxide layers 104, as TMAH has an etch rate that is at least 5 times higher for undoped polysilicon than doped polysilicon of dopant concentration of at least about $10^{18}$ cm$^{-3}$. The selective etch may an isotropic wet etch or dry etch. The resulting structure is shown in FIG. 2(*b*).

Other etchants with high selectivity of undoped polysilicon over doped polysilicon may also be used. For example, potassium hydroxide (KOH) has a selectivity of 20:1 for undoped polysilicon over doped polysilicon of a dopant concentration exceeding $10^{20}$ cm$^{-3}$. Likewise, an aqueous solution of ethylene diamine and pyrocatechol (EDP) has a selectivity of 50:1 for undoped polysilicon over doped polysilicon of a dopant concentration exceeding $7.0 \times 10^{19}$ cm$^{-3}$.

Figure 1B:
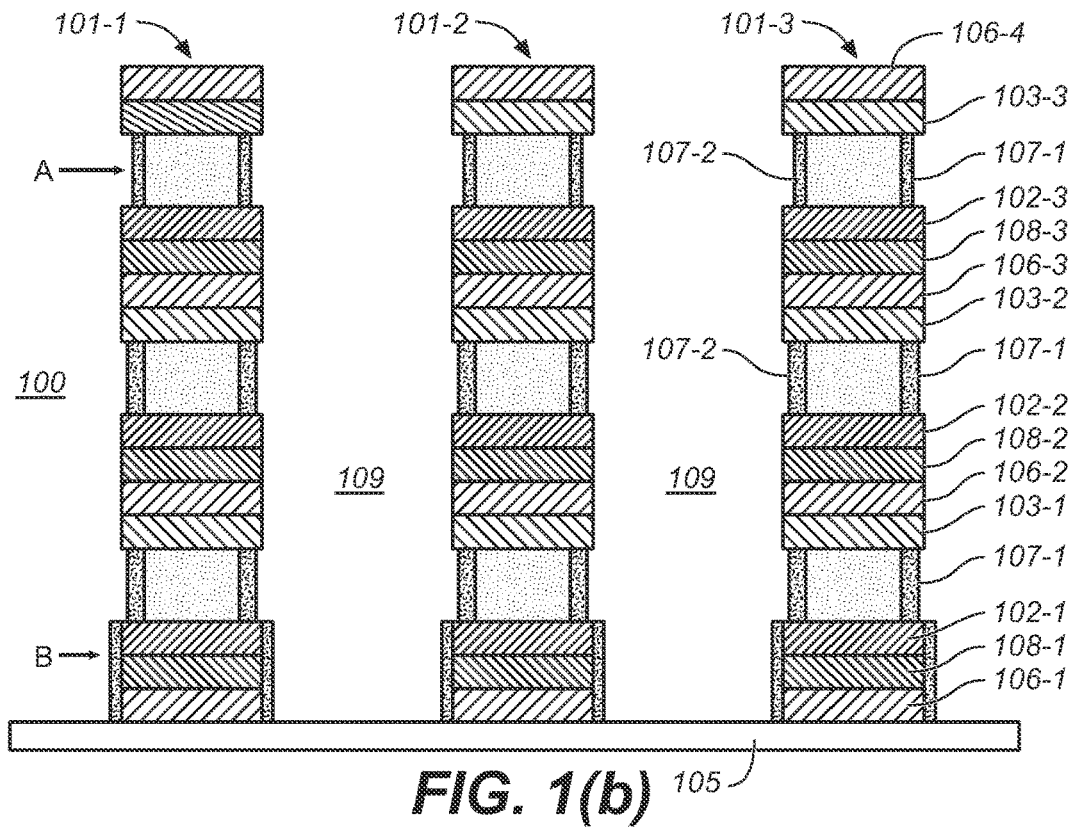
FIG. 1(b) shows one instance of resulting structure 100 after a separation etch.

According to another embodiment of the present invention, body oxide layers 104 of structure 100 of FIG. 1(*a*) is carbon-doped, as deposited, while common drain regions 102 and common source regions 103 are arsenic-doped (i.e., n$^+$-type). In this embodiment, body oxide layer 104 may be, for example, a 50-nm thick carbon-doped oxide with a carbon dopant concentration of about $5.0 \times 10^{20}$ cm$^{-3}$ or greater. After conformal deposition of channel semiconductor material layers 107 (e.g., in situ boron-doped polysilicon of a desired dopant concentration), an RTA step (e.g., at 750° C. for 10 min.) is carried out. As a result of the annealing step, carbon from body oxide layers 104 out-diffuses into their adjacent portions of channel semiconductor material 107, resulting in a dopant concentration in those portions of, for example, to about $5.0 \times 10^{20}$ cm$^{-3}$.

A selective etch using, for example, EDP may be used to remove channel semiconductor material 107-1 from the sidewalls of trenches 109, leaving behind carbon-doped channel semiconductor material 107-2 in the recesses of body oxide layers 104, as EDP has an etch rate that is at least 100 times higher for undoped polysilicon than carbon-doped polysilicon of dopant concentration of at least about $10^{20}$ cm$^{-3}$. The selective etch may an isotropic wet etch or dry etch.

Figure 3:
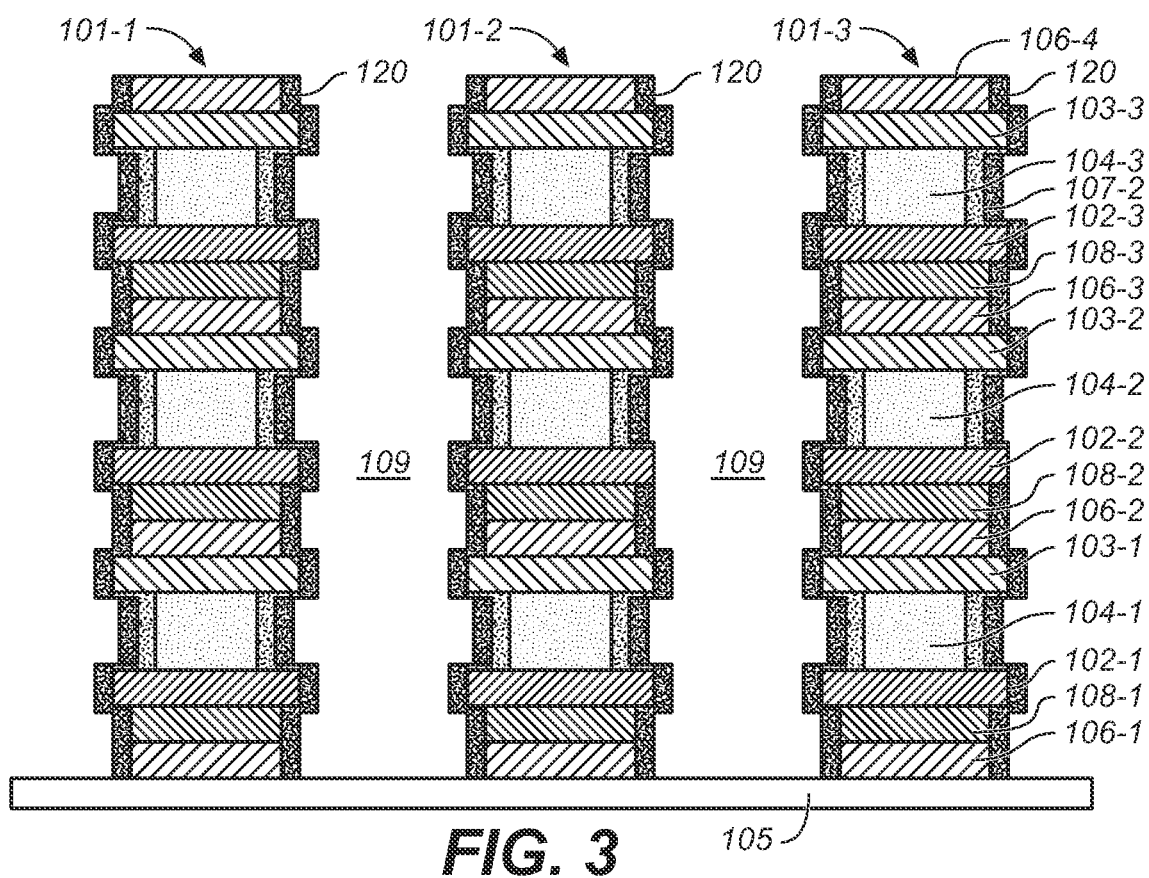
FIG. 3 shows, after the selective etch of FIG. 2(b), a thin layer of phosphorus silicate glass (PSG), e.g., 10-nm thick, may be deposited on structure 100, in accordance with one embodiment of the present invention.

One consideration associated with the methods of the present invention is their effects on the threshold voltage (V$_{th}$) of the resulting thin-film transistor. In one embodiment, at a dopant concentration of $5.0 \times 10^{19}$ cm$^{-3}$, the resulting V$_{th}$ may be much greater than the more desirable 1.5 volts achievable at the lesser dopant concentration of $5.0 \times 10^{18}$ cm$^{-3}$. In that regard, to take advantage of the high selectivity of either KOH or EDP, the V$_{th}$ of the resulting thin-film transistors may be too high. To fine-tune the dopant concentration, one may counter-dope channel semiconductor material 107-2 after the selective etch of FIG. 2(*b*). According to one embodiment of the present invention, after the selective etch of FIG. 2(*b*), a thin layer 120 of phosphorus silicate glass (PSG), e.g., 10-nm thick, may be deposited on structure 100, as shown in FIG. 3. Phosphorus in the PSG is then allowed to diffuse into channel semiconductor material 107-2 in a subsequent annealing step. The initial dopant concentration in the PSG, and the temperature and the duration of this subsequent RTA step may be empirically determined to achieve a given desired V$_{th}$ in the resulting thin-film transistors. Generally, at temperatures lower than 1000° C., phosphorus has a greater diffusion rate in polysilicon than boron. PSG layer 120 may be removed by wet isotropic etching after the RTA step (e.g., using hydrofluoric acid (HF)).

Alternatively, rather than converting the dopant concentration in the portions of channel semiconductor material 107 adjacent body oxide layers 104, one may instead convert portions of channel semiconductor material 107 on the sidewalls of trenches 109. According to one embodiment of the present invention, isolation layers 106 are initially deposited as heavily doped n$^{++}$-type c-silicon (SiOC), with a phosphorus dopant concentration of greater than $5.0 \times 10^{20}$ cm$^{-3}$, for example. In this embodiment, channel semiconductor material 107 may be deposited in situ doped to the desired dopant concentration for the channel regions (e.g., $1.0 \times 10^{18}$ cm$^{-3}$). Without a high dopant concentration in body oxide layers 104, a subsequent RTA annealing step turns the portions of channel semiconductor material 107 adjacent isolation layers 106 into n-type semiconductor material 107-3, as shown FIG. 4(*i*). Using HF or a fluoro-carbon gas, n-type channel semiconductor material 107-3 may be removed at up to a 40:1 selectivity of n$^{++}$-type polysilicon (e.g., dopant concentration of $3.0 \times 10^{20}$ cm$^{-3}$ or greater) over p-type polysilicon. It is believed that the difference in selectivity results from sensitivity to the phosphorus dopant profile. (See, e.g., Solid State Science and Technology, 2 (9). pp. 380-P383 (2013)). The resulting structure is shown FIG. 4(*ii*). Note that, unlike the other embodiments described above, in this embodiment, some portions of channel semiconductor material 107-3 remains on the sidewalls of trenches 109, although the result channel regions in the active strips achieve electrical isolation from each other.

Figure 5I:
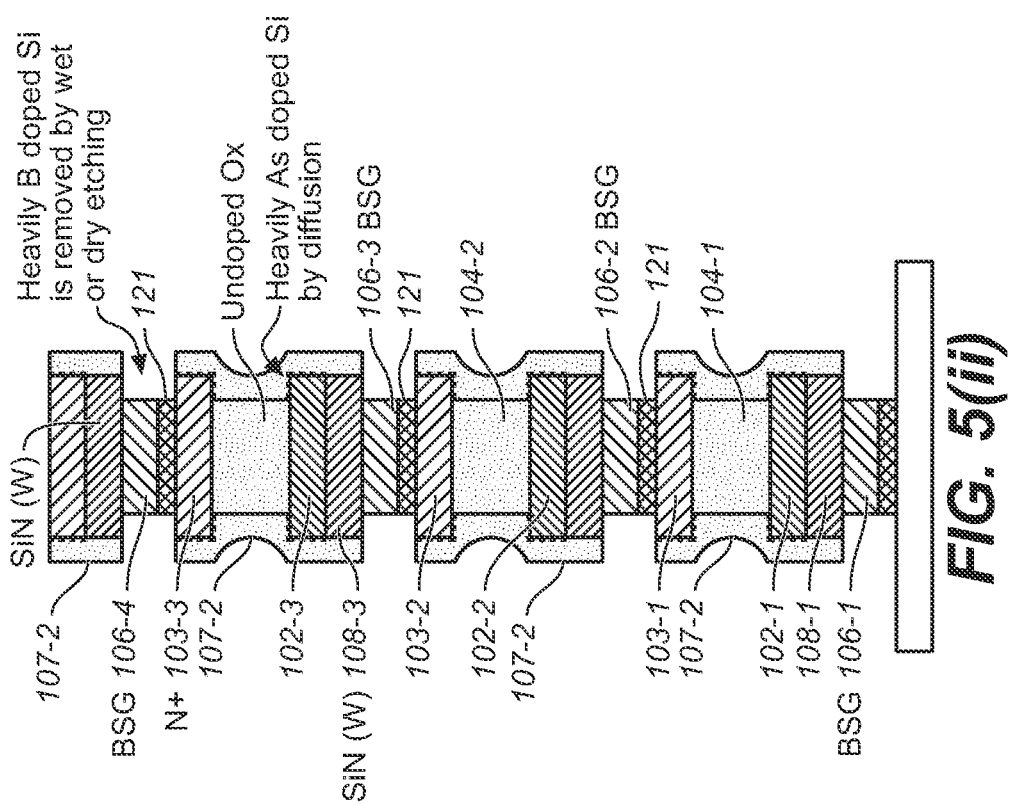
FIGS. 5(i) and (ii) illustrate a second embodiment of the present invention, in which isolation layers 106 dope their adjacent channel semiconductor material 107 for selective removal, in accordance with one embodiment of the present invention.
Figure 5:
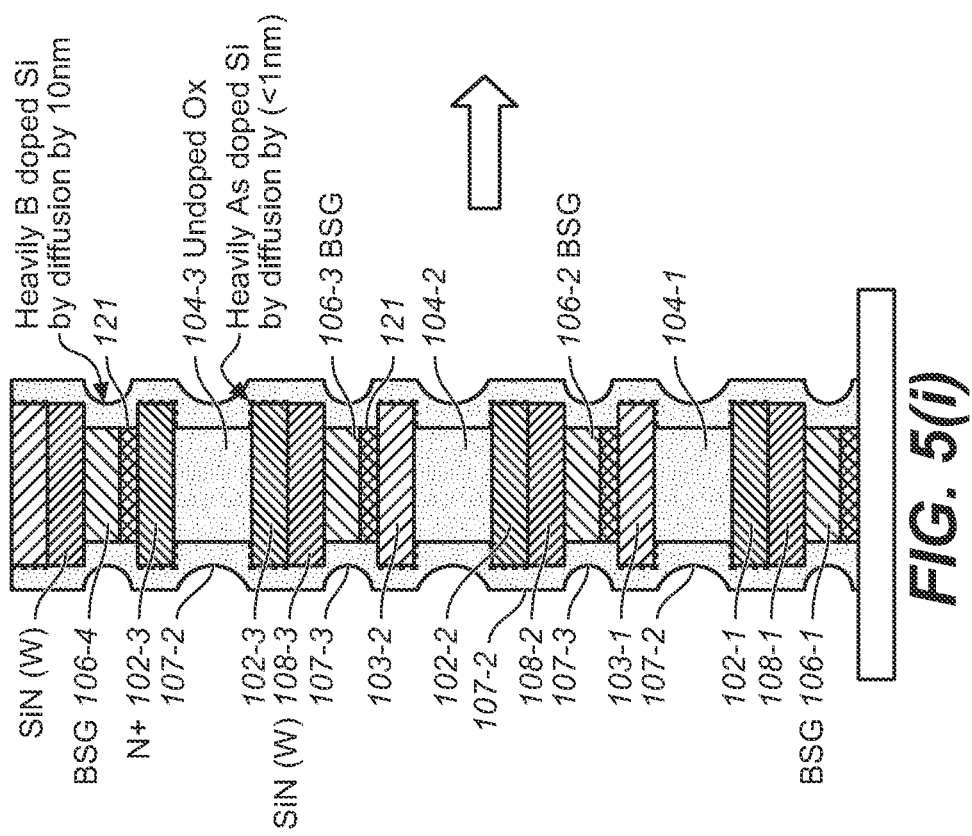

According to another embodiment of the present invention, isolation layers 106 are initially deposited as heavily doped p$^{++}$-type borosilicate (BSG), with a boron dopant concentration of greater than $5.0 \times 10^{21}$ cm$^{-3}$, for example. In this embodiment, a 10-nm thick channel semiconductor material 107 may be deposited in situ doped to the desired dopant concentration for the channel regions (e.g., $1.0 \times 10^{18}$ cm$^{-3}$). An RTA annealing step (e.g., at 600° C. for a duration of 14 minutes, including the deposition time of channel semiconductor material 107) turns the portions of channel semiconductor material 107 adjacent isolation layers 106 into 10-nm thick p-type semiconductor material 107-3, as shown in FIG. 5(*i*). At 600° C., boron diffuses substantially faster than arsenic, such that the diffusion into the portions of channel semiconductor material 107 adjacent common source regions 103 and common drain regions 102 are inconsequential (e.g., less than 1.0 nm). Note that in FIGS. 5(*i*) and (*ii*), buffer oxide layer 121 may be added between isolation layers 106 and adjacent common source regions 103 to avoid boron diffusion into source regions 103. Also, BSG layers 106, buffer oxide 121 and body oxide layers 104 are recessed in a previous oxide etch step.

Using an aqueous HF solution (e.g., one part HF to 50 parts nitric acid and 100 parts acetic acid, by volume), p-type channel semiconductor material 107-3 may be removed at up to a 50:1 selectivity of p-type polysilicon (e.g., dopant concentration of $5.0 \times 10^{21}$ cm$^{-3}$ or greater) over undoped or lightly-doped polysilicon. An even greater selectivity may be achieved using a lower percentage of nitric acid (HNO$_3$). To achieve the same result in a dry-etch step, HF, HNO$_3$ and acetic acid ($CH_3COOH$) vapors may be used. (See, e.g., U.S. Pat. No. 4,681,657 to Hwang et al.). The resulting structure is shown in FIG. 5(ii).

Alternatively, rather than BSG, PSG may be used as isolation layers 106. FIGS. 6(i)-6(iii) illustrate a third alternatively embodiment of the present invention, in which isolation layers 106 dope their adjacent channel semiconductor material 107 for selective removal, in accordance with one embodiment of the present invention. As shown in FIG. 6(i), isolation layers 106 are initially deposited as heavily doped PSG, with a phosphorus dopant concentration of greater than $1.0\times10^{22}$ $cm^{-3}$, for example. In this embodiment, channel semiconductor material 107 may be deposited as in situ doped amorphous silicon at 550° C. or as polysilicon at 625° C. to the desired dopant concentration for the channel regions (e.g., $1.0\times10^{18}$ $cm^{-3}$). In addition, 2-nm capping layer 122 of silicon oxide or silicon nitride, deposited at a temperature of 650° C. or less may be provided to prevent diffusion of the phosphorus out of channel semiconductor material 107. In this embodiment, both common source regions 103 and common drain regions 102 are provided adjacent metal layers 108 to reduce resistivity.

Thereafter, as illustrated in FIG. 6(ii), an RTA annealing step at 820° C. for 60 seconds or less turns the portions of channel semiconductor material 107 adjacent isolation layers 106 into heavily doped n-type channel semiconductor material 107-3, activating the phosphorus dopants at the same time (e.g., to an equilibrium dopant concentration of about $3.0\times10^{20}$ $cm^{-3}$). The deposited amorphous silicon is also crystallized as channel semiconductor material 107-2. At 820° C., arsenic diffusion from common source regions 103 and common drain regions 102 into channel semiconductor 107 is insignificant.

Thereafter, capping layer 122 is isotropically removed. Using an atomic chlorine gas, heavily-doped n-type channel semiconductor material 107-3 may be removed at a greater than 6:1 selectivity of n-type polysilicon (e.g., dopant concentration of about $3.0\times10^{20}$ $cm^{-3}$ or greater) over lightly-doped p-type polysilicon, as illustrated in FIG. 6(iii).

The above detailed description is provided to illustrate specific embodiments of the present invention and is not intended to be limiting. Numerous modifications and variations within the scope of the present invention are possible. The present invention is set forth in the accompanying claims.

We claim:

1. A process, comprising:
forming a plurality of thin-film layers successively above a planar surface of a substrate, wherein the thin-film layers include first and second isolation layers, and a plurality of active layers, each active layer comprising a material suitable for forming a drain region or a source region of a thin-film transistor, wherein the first isolation layer is formed between and in contact with two active layers and wherein the first isolation layer has a greater concentration of a first dopant specie than the second isolation layer;
forming a trench through the thin-films to expose the thin-films on sidewalls of the trench;
depositing conformally a semiconductor material on the sidewalls of the trench;
bringing the first isolation layer to a predetermined temperature for a predetermined duration, such that a portion of the first dopant specie diffuses out of the first isolation layer to dope a portion of the semiconductor material; and selectively etching the semiconductor material, such that the doped portion of the semiconductor material is removed.

2. The process of claim 1, further comprising etching the thin-film layers such that the first isolation layer recesses from the sidewalls of the trench.

3. The process of claim 1 wherein the semiconductor material comprises at least one of: an amorphous silicon and a polysilicon.

4. The process of claim 1, wherein the selective etching comprises a dry etching step.

5. The process of claim 1, wherein the first dopant specie comprises boron.

6. The process of claim 5, wherein (i) the first isolation layer comprises one or more of: an organosilicon layer, a silicon nitride layer and a silicate glass, and (ii) the selective etching uses an etchant that comprises at least one of: tetra-methyl ammonium hydroxide (TMAH), potassium hydroxide (KOH), and ethylene diamine and pyrocatechol (EDP).

7. The process of claim 6, wherein the organosilicate layer comprises SiOCH or SiOC.

8. The process of claim 6, wherein the first isolation layer comprises a carbon-doped layer having a carbon dopant concentration of about $10^{20}$ $cm^{-3}$ or greater, and wherein the selective etching uses an etchant that comprises ethylene diamine and pyrocatechol (EDP).

9. The process of claim 6, wherein the predetermined temperature is achieved by a rapid thermal annealing step.

10. The process of claim 9, wherein the predetermined temperature is between 650° C. and 820° C., preferably about 750° C.

11. The process of claim 1, further comprising depositing a highly doped material adjacent and over the semiconductor material, the highly doped material comprises a second dopant specie.

12. The process of claim 11, further comprising allowing the second dopant specie to diffuse into the semiconductor material to achieve an effective dopant concentration in the semiconductor material.

13. The process of claim 12, wherein the effective dopant concentration determines a threshold voltage of a thin-film transistor in which the semiconductor material serve as a channel region.

14. The process of claim 11, wherein the second dopant specie comprise phosphorus.

15. The process of claim 1, wherein (i) the first isolation layer comprises one or more of: an organosilicon layer, a silicon nitride layer and a silicate glass, and (ii) the selective etching uses an etchant that comprises at least one of: atomic chlorine, HF and a fluorocarbon gas.

16. The process of claim 15, wherein the predetermined temperature is achieved by a rapid thermal annealing step.

17. The process of claim 15, wherein the predetermined temperature is between about 600° C. and about 820° C., preferably about 750° C.

18. The process of claim 15, wherein the first dopant specie comprises phosphorus.

19. The process of claim 18, wherein the etchant comprises an aqueous HF solution that includes both HF and one or more of: nitric acid and acetic acid.

20. The process of claim 15, wherein the first isolation layer comprises a borosilicate glass or phosphorus silicate glass with a dopant concentration of boron or phosphorus greater than $1.0\times10^{22}$ $cm^{-3}$.

21. The process of claim 1, further comprising depositing a capping layer over the conformally deposited semiconductor material.

\* \* \* \* \*